(12) United States Patent
Baorda et al.

(10) Patent No.: US 10,788,920 B2
(45) Date of Patent: Sep. 29, 2020

(54) DIFFERENTIAL CURRENT CONVEYOR CIRCUIT, CORRESPONDING DEVICE, AND METHOD OF OPERATION THEREOF

(71) Applicant: STMicroelectronics S.r.l., Agrate Brianza (IT)

(72) Inventors: Roberto Pio Baorda, Binasco (IT); Paolo Angelini, Bologna (IT); Danilo Karim Kaddouri, Pero (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 208 days.

(21) Appl. No.: 15/797,814

(22) Filed: Oct. 30, 2017

(65) Prior Publication Data
US 2018/0284939 A1   Oct. 4, 2018

(30) Foreign Application Priority Data
Mar. 28, 2017  (IT) .......................... 102017000034042

(51) Int. Cl.
*G06F 3/041* (2006.01)
*G05F 3/26* (2006.01)
*H03F 3/345* (2006.01)
*H03H 11/02* (2006.01)
(Continued)

(52) U.S. Cl.
CPC ............ *G06F 3/0416* (2013.01); *G05F 3/262* (2013.01); *H03F 3/345* (2013.01); *H03F 3/45273* (2013.01); *H03H 11/025* (2013.01); *G06F 3/044* (2013.01); *G06F 2203/04104* (2013.01); *H03F 2200/91* (2013.01)

(58) Field of Classification Search
None
See application file for complete search history.

(56) References Cited

U.S. PATENT DOCUMENTS

2015/0054772 A1* 2/2015 Jain ........................ G06F 3/0418
                                                                345/174

FOREIGN PATENT DOCUMENTS

EP              0383397 A2     2/1990

OTHER PUBLICATIONS

Alzaher, H.A., "CMOS highly linear fully differential current conveyor," Electronics Letters, vol. 40, No. 4, Feb. 19, 2004, XP002776786.
(Continued)

*Primary Examiner* — Amare Mengistu
*Assistant Examiner* — Sarvesh J Nadkarni
(74) *Attorney, Agent, or Firm* — Slater Matsil, LLP (57) ABSTRACT

A differential current conveyor circuit includes two or more single-ended current conveyor stages and a common bias stage. First and second switches are set between the control terminals of the transistors in the common bias stage and a respective one of a first and a second coupling line of the single ended stages can be switched between the following: a reset state of the circuit with the transistors in the common bias stage coupled to the first and second coupling lines with the single-ended stages set to a bias condition; and a sensing state of the circuit with the transistors in the common bias stage decoupled from the first and second coupling lines, with the single-ended stages in a high impedance state with the control terminals of the input transistors of the single ended stages capacitively coupled to the input terminal.

22 Claims, 6 Drawing Sheets

(51) Int. Cl.
  *H03F 3/45* (2006.01)
  *G06F 3/044* (2006.01)

(56) References Cited

OTHER PUBLICATIONS

Kumngern, Montree et al., "0. 5-V 1.13 bulk-driven fully differential current conveyor," IEEE Symposium on Computer Applications and Industrial Electronics (ISCAIE), Apr. 7, 2014, pp. 184-188, XP032720071.

Brunn, Erik, "Noise Properties of CMOS Current Conveyors," IEEE Proceedings of the International Symposium on Circuits and Systems, vol. 1, 1996. p. 144-147.

Elwan, Hassan O. et al., "Low-Voltage Low-Power CMOS Current Conveyors," IEEE Transactions on Circuits and Systems, Fundamental Theory and Applications, vol. 44, No. 9, Sep. 1997, pp. 828-835.

Mahmoud et al., "Digitally controlled fully differential current conveyor: CMOS realization and applications," IEEE International Symposium on Circuits and Systems (ISCAS), May 23-26, 2005, pp. 1622-1625.

Surakampontorn, W. et al., "Accurate CMOS-based Current Conveyors" IEEE Transactions on Instrumentation and Measurement, vol. 40. No. 4, Aug. 1991, pp. 699-702.

* cited by examiner

DIFFERENTIAL CURRENT CONVEYOR CIRCUIT, CORRESPONDING DEVICE, AND METHOD OF OPERATION THEREOF

CROSS-REFERENCE TO RELATED APPLICATIONS

This application claims priority to Italian Application No. 102017000034042, filed on Mar. 28, 2017, which application is hereby incorporated herein by reference.

TECHNICAL FIELD

The description relates generally to current conveyor circuits, and in particular embodiments, to a differential current conveyor circuit, a corresponding device, and a method of operation thereof.

BACKGROUND

Current conveyors circuits are suited to be used in various operational contexts.

By way of example, current conveyors are useful in providing a building block of the analog front end of touch screen controllers, for instance in those situations where it is desired to read a set of sensing capacitors. Touch screen controllers have been recently introduced, e.g. for use in mobile devices, which may provide true multi-touch capability, supporting virtually unlimited simultaneous touches. The FingerTip® family of controllers developed by the applicant company are exemplary of such controllers.

The following documents are exemplary of the extensive activity devoted over the years to current conveyor circuits: W. Surakampontorn, et al.: "Accurate CMOS-based Current Conveyors" IEEE TRANSACTIONS ON INSTRUMENTATION AND MEASUREMENT, VOL. 40. NO. 4 August 1991, pp. 699-702; Erik Bruun: "Noise Properties of CMOS Current Conveyors, Proceedings of the 1996 IEEE International Symposium on Circuits and Systems. Vol. Volume 1 IEEE, 1996. p. 144-147; H. O. Elwan et al.: "Low-Voltage Low-Power CMOS Current Conveyors", IEEE TRANSACTIONS ON CIRCUITS AND SYSTEMS—I: FUNDAMENTAL THEORY AND APPLICATIONS, VOL. 44, NO. 9, September 1997, pp. 828-835; S. A. Mahmoud, et al.: "Digitally controlled fully differential current conveyor: CMOS realization and applications", IEEE International Symposium on Circuits and Systems (ISCAS) May 23-26, 2005 Kobe, Japan pp. 1622-1625; and EP 0 383 397 B1.

SUMMARY

Despite such intensive activity, and the availability of circuits for implementing single ended current conveyor blocks, a demand is still felt for improved current conveyor arrangements capable of realizing a transfer function of a differential current conveyor, with the ability of providing one or more of the following features: low input impedance to differential input signals, this is desirable in order to sink the differential charge coming from different sensing capacitors; high input impedance to common mode signal on differential input signals, this is desirable in order to reject the common mode charge coming from parasitic capacitors; or high output impedance, this is desirable in order to deliver the differential charge sunk at the input nodes to the output.

One or more embodiments may relate to a corresponding device (for instance a touch-screen controller) and apparatus (for instance mobile communication apparatus) as well as to a corresponding method, which may provide one or more of the aforementioned features.

One or more embodiments may apply to differential current conveyor circuits which may be used in touch-screen controllers.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
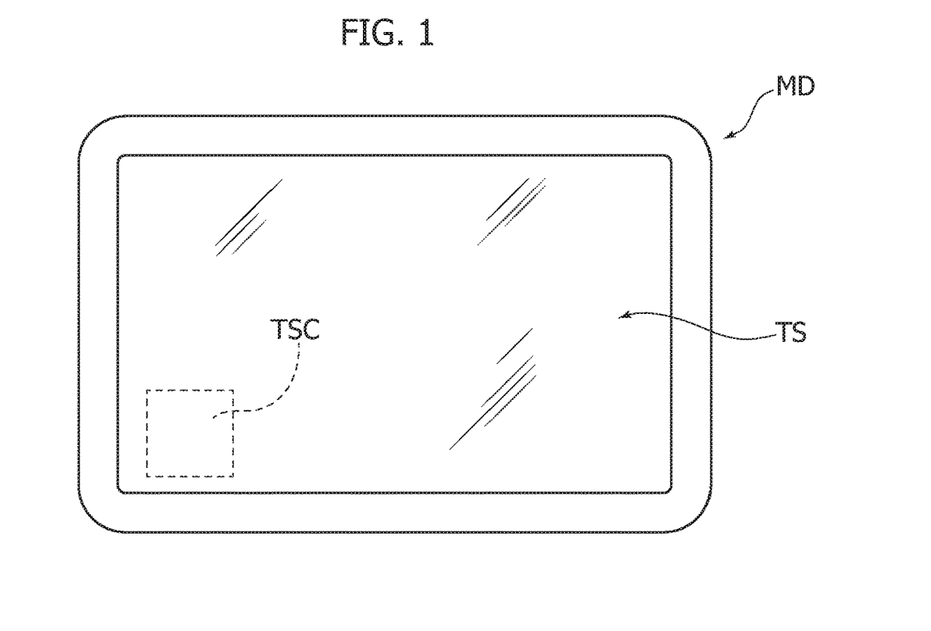
FIGS. 1 and 2 are exemplary of a possible context of use of embodiments.

FIG. 1 is exemplary of a possible context of use of embodiments, namely a mobile (for instance, communication) device MD such as a smartphone, a tablet, a laptop computer—this list being merely exemplary and not limitative—including a touch screen TS with a touch screen controller TSC, providing for instance multi-touch capability, supporting simultaneous touches.

According to an arrangement, a current conveyor may be included in a controller TSC. For instance, a current conveyor may be included in the analog front end of a touch screen controller to provide the capability of reading a set of sensing capacitors.

Of course, reference to this possible context of use is merely exemplary and thus non-limiting of the scope of the embodiments.

Figure 2:
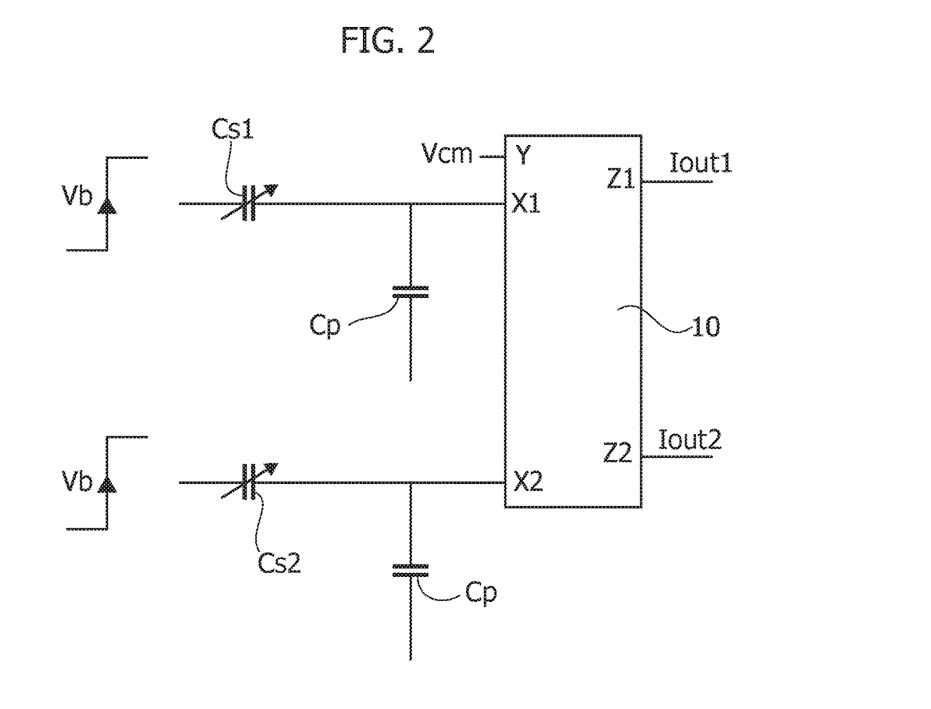

As shown in FIG. 2, a current conveyor 10 may be used in a differential configuration where a signal to be extracted from the touch panel or screen TS is given by a variation of the capacitance $C_{S1}$, associated to one node X1 with respect to the capacitance $C_{S2}$ associated to (at least) one other node X2 of the panel.

While this task can be achieved in different ways, a readout technique based on capacitance-to-current conversion using current conveyor circuits providing corresponding currents e.g. Iout1, Iout2 at output nodes, e.g. Z1, Z2, may provide a number of advantages over other techniques.

FIG. 2 (where Vcm indicates a reference voltage) shows a simple model of the panel/screen and the first stage of the readout chain, which in "last generation" touch panels may exhibit a large parasitic capacitance $C_p$ between each node and a common node which can be noisy.

By way of non-limiting reference, typical variations of $C_s$ when a finger touches the panel may be in the order of 100 fF, while the capacitance $C_p$ can be in the order of 1 nF. Assuming (again by way of non-limiting reference) that voltage noise on the common node may be about 300 mV, with a toggling signal $V_b$ of 3V, the noise charge coming from $C_p$ may be much larger than the signal charge coming from $C_s$.

For that reason, being able to cancel out the noise coming from $C_p$ at the first stage of the reading chain is desirable.

As noted a differential (e.g. fully differential) current conveyor circuit is desirable to implement a differential reading chain which facilitates rejecting the common mode noise, with one or more of following features are desirable for such differential current conveyor: a low input impedance to a differential signal on $X_1$ and $X_2$ inputs in order to facilitate sinking the differential charge coming from $C_{s1}$ and $C_{s2}$ capacitors; a high input impedance to common mode signal on $X_1$ and $X_2$ terminal in order to facilitate rejecting the common mode charge coming from the capacitors $C_{p1}$ and $C_{p2}$; a high output impedance in order to facilitate delivering the differential charge sunk at the input nodes to the output.

S. A. Mahmoud, et al. (already cited) have proposed a differential current conveyor circuit wherein common mode signals applied on X+ and X− input nodes are transferred to the output nodes Z+ and Z− as a common mode signal; even if this circuit may be regarded as implementing of a fully differential current conveyor, it still exhibits a low input impedance to common mode signals, thus failing to provide a high input impedance to common mode signals as desirable in order to reject the large noise coming from the $C_p$ capacitors.

Figure 3:
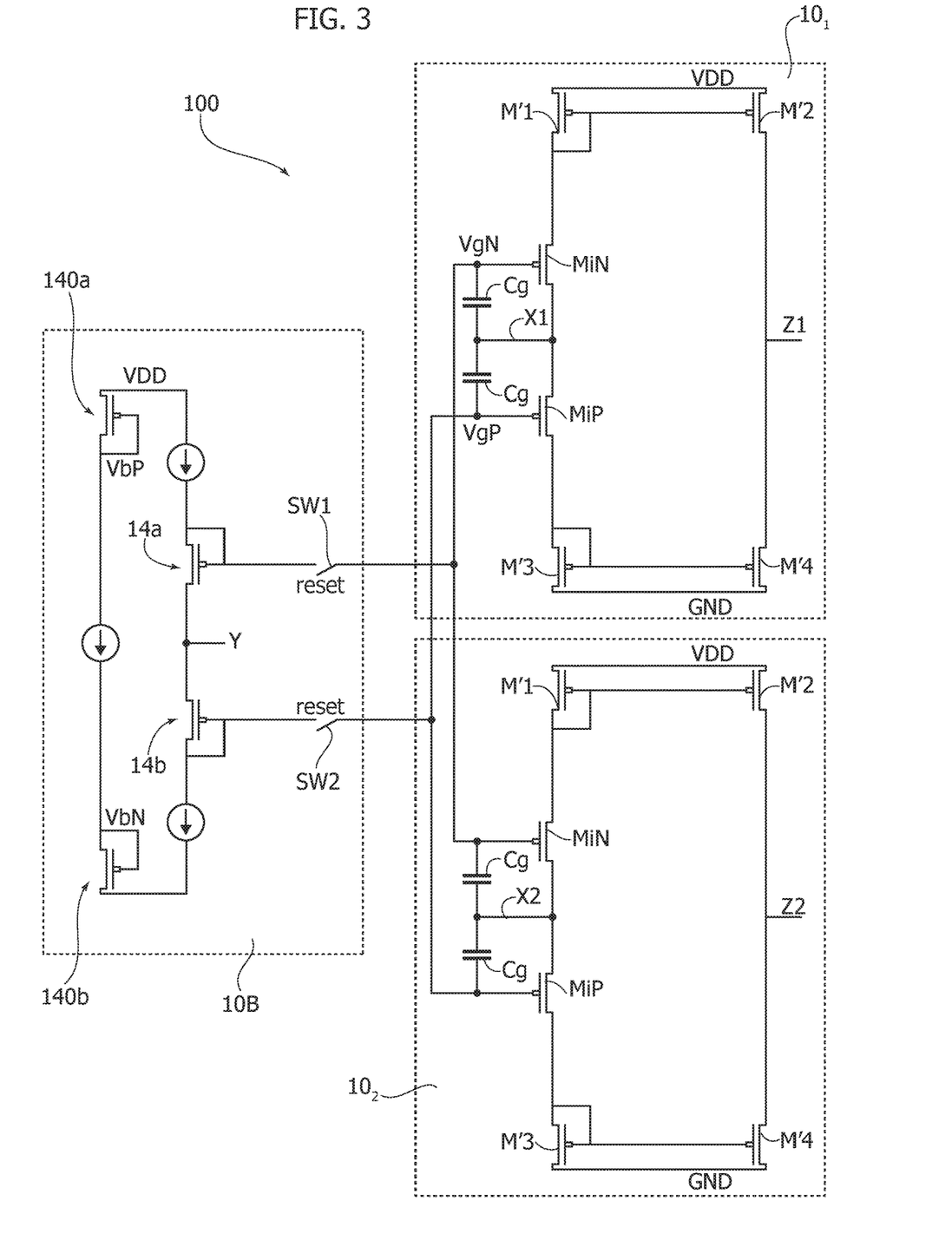
FIG. 3 is a circuit diagram exemplary of embodiments.

One or more embodiments address that issue by a circuit 100 as shown in FIG. 3, which can be regarded as conceptually including three main blocks: two (identical) single-ended class AB current conveyors $10_1$, $10_2$ and one common bias circuit 10B set between a supply line VDD and ground GND.

In the arrangement of FIG. 3, the control terminals (e.g. gates) of the input transistors MiN (for instance, NMOS) of the two single-ended current conveyors $10_1$, $10_2$ are shorted together (see VgN) and coupled to the two input nodes X1 and X2 via capacitors $C_g$. Similarly, the input transistors MiP (e.g. PMOS) of the two single-ended current conveyors $10_1$, $10_2$ are shorted together (see VgP) and coupled to the two input nodes X1 and X2 via capacitors $C_g$. Moreover the input transistors MiN and MiP are also coupled to the common bias circuit 10B via two switches SW1, SW2 operable by a signal called 'reset' (from a control circuit, not visible in the drawing).

When the reset signal is at a first level (e.g. high) the circuit 100 is in a reset phase, meaning that the bias block 10B is connected (via the switches SW1, SW2 made conductive) to the two single-ended current conveyor blocks $10_1$, $10_2$, in order to set a desired bias condition.

After the reset phase, the reset signal may be brought to a second level (e.g. low) and the circuit enters a 'sense' phase, where the bias circuit 10B is separated (due to the switches SW1, SW2 made non-conductive) from the gates of the input NMOS and PMOS transistors MiN, MiP of the two current conveyor blocks $10_1$, $10_2$ which are left in a high impedance state, coupled to the input nodes X1 and X2 through the capacitors $C_g$.

If during the sense phase a common mode signal is applied to the X1 and X2 nodes, the VgN and VgP nodes move together with X1 and X2, so the current in the input branch (e.g. MiN, MiP) of each single-ended current conveyor 10A, 10B does not change, with no signal transferred to the output.

On the other hand, if a differential signal is applied to X1 and X2, the VgN and VgP nodes do not move as X1 and X2 do, so the (gate-source) voltage Vgs of the input NMOS and PMOS transistors MiN, MiP changes and the signal current enters the system through X1 and X2 nodes; then the current sunk or sourced from X1 and X2 is mirrored via the current mirrors M1, M2 and M3, M4 at the high impedance output nodes $Z_1$ and $Z_2$.

Figure 4:
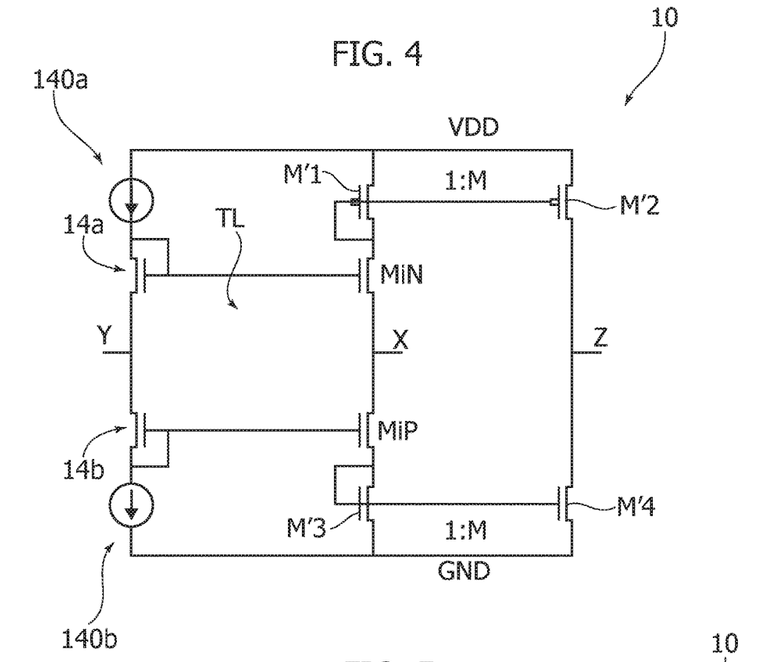
FIGS. 4 and 5 are circuits explanatory of possible features of embodiments.

A circuit as exemplified in FIG. 3 may satisfactorily meet the requirement discussed in the foregoing by adopting for both single-ended current conveyors $10_1$, $10_2$ a circuit arrangement which essentially corresponds (if one considers one of single-ended current conveyors $10_1$, $10_2$ as individually coupled to bias block 10B by the switches SW1, SW2) to the single-ended push-pull current conveyor circuit shown in FIG. 4.

FIG. 4 is exemplary of a current conveyor circuit 10 based on a push-pull source follower arrangement including a translinear loop configuration TL, that is a loop applying the translinear principle, namely a closed loop containing an even number of translinear elements (TEs) with an equal number of them arranged clockwise and counter-clockwise, the product of the currents through the clockwise TEs being equal to the product of the currents through the counter-clockwise TEs.

The circuit shown in FIG. 4 includes (set between a supply line VDD and ground GND): a pair of transistors MiN, MiP (e.g. MOSFETs of opposing polarities such as NMOS and PMOS) arranged with their current paths (source-drain path, in the case of field effect transistors such a MOSFETs) in series and coupled at an intermediate point therebetween providing an input terminal X (that is X1 or X2) and two diode-connected transistors (e.g. again MOSFETs of opposing polarities) M'1, M'3 active on the current paths of the transistors MiN, MiP. The circuit shown in FIG. 4 also includes a further pair of transistors (e.g. again MOSFETs of opposing polarities) 14a, 14b arranged with their current paths in series and coupled at a (further) intermediate point therebetween providing a further input terminal Y of the circuit, wherein the transistors 14a, 14b have their control terminals (gates, in the case of field effect transistors such a MOSFETs) coupled to the control terminals of the transistors MiN, MiP in a translinear loop configuration. The circuit also includes two current sources 140a, 140b (e.g. two further diode-connected transistors, see the bias block 10B in FIG. 3) active on the current paths of the transistors 14a, 14b, and two transistors M'2, M'4 coupled in a (e.g. 1:M) current mirror arrangement with the transistors M'1, M'3; the transistors M'2, M'4 are arranged with their current paths in series and coupled at an intermediate point therebetween providing the output terminal Z of the circuit.

It was observed that the amount of common mode noise that can be handled and rejected by employing for the current conveyors $10_1$, $10_2$ a circuit as shown in FIGS. 3 and 4 is limited by the voltage dynamic range available at the input nodes X1 and X2, that is by the voltage drop on the diode-connected NMOS and PMOS transistors M1, M3.

Figure 5:
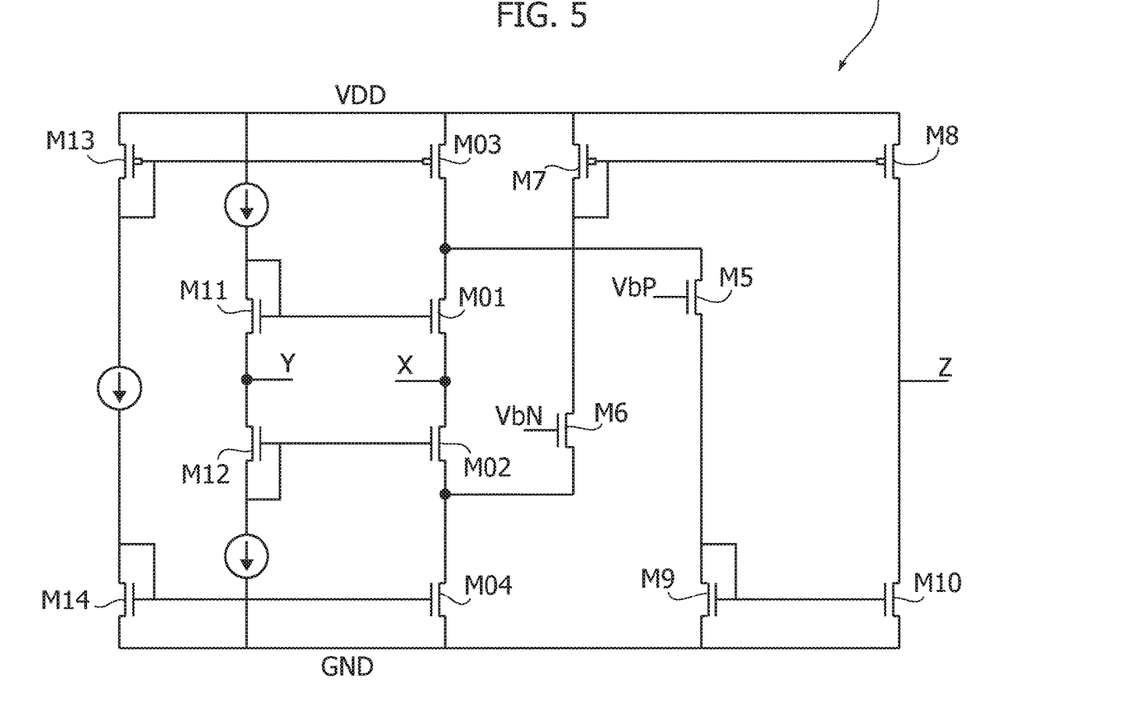

As discussed in detail in a co-pending Italian patent application (Italian Patent Application No. 102017000034026) filed on even date by the same Applicants and incorporated herein by reference, in one or more embodiments the input dynamic range can be improved by resorting for both blocks $10_1$, $10_2$ to a wide input swing, low-noise class AB current conveyor 10 corresponding, by way of direct comparison with FIG. 4, to the transistor-level schematics shown in FIG. 5.

In this way the diode connected NMOS and PMOS transistors M'1, M'2 are removed and replaced by bias generators M03, M04 active on the current paths of the transistors MiN, MiP (designated M01 and M02 in FIG. 5) with the dynamic range increased so that a large amount of common mode noise can be handled by the circuit without saturation.

Also (again as discussed in detail in the captioned co-pending application) a pair of current buffers (M5, M6 in FIG. 5) having respective inputs and outputs may be provided having their inputs coupled to the current paths of the transistors MiN, MiP (M01, M02 in FIG. 5) opposite the intermediate point X with a summation node coupled to the outputs of these current buffers to provide the output terminal Z of the circuit.

More specifically, the current buffers M5, M6 may have their respective inputs coupled between the transistor MiN (M01) and an associated bias generator M03, M13 replacing the diode-connected transistor M'1, and between the transistor MiP (M02) and an associated bias generator M04, M14 replacing the diode-connected transistor M'3.

In one or more embodiments the current buffers may include common gate connected transistors M5, M6 and the output node Z may be provided by a summation node including current mirrors M7, M8 and M9, M10 coupled with the outputs of the current buffers M5, M6. In one or more embodiments the current mirrors may include diode-connected transistors (e.g. M7 and M9).

To sum up, in the transistor-level representation of FIG. 5 the following relationships apply: transistors 14a, 14b of FIGS. 3 and 4 may be identified with transistors M11, M12 of FIG. 5; transistors MiN, MiP of FIGS. 3 and 4 may be identified with transistors M01, M02 of FIG. 5; generators M'1, M'3 of FIGS. 3 and 4 may be identified with transistors M03, M13 and M04, M14 of FIG. 5.

Figure 6:
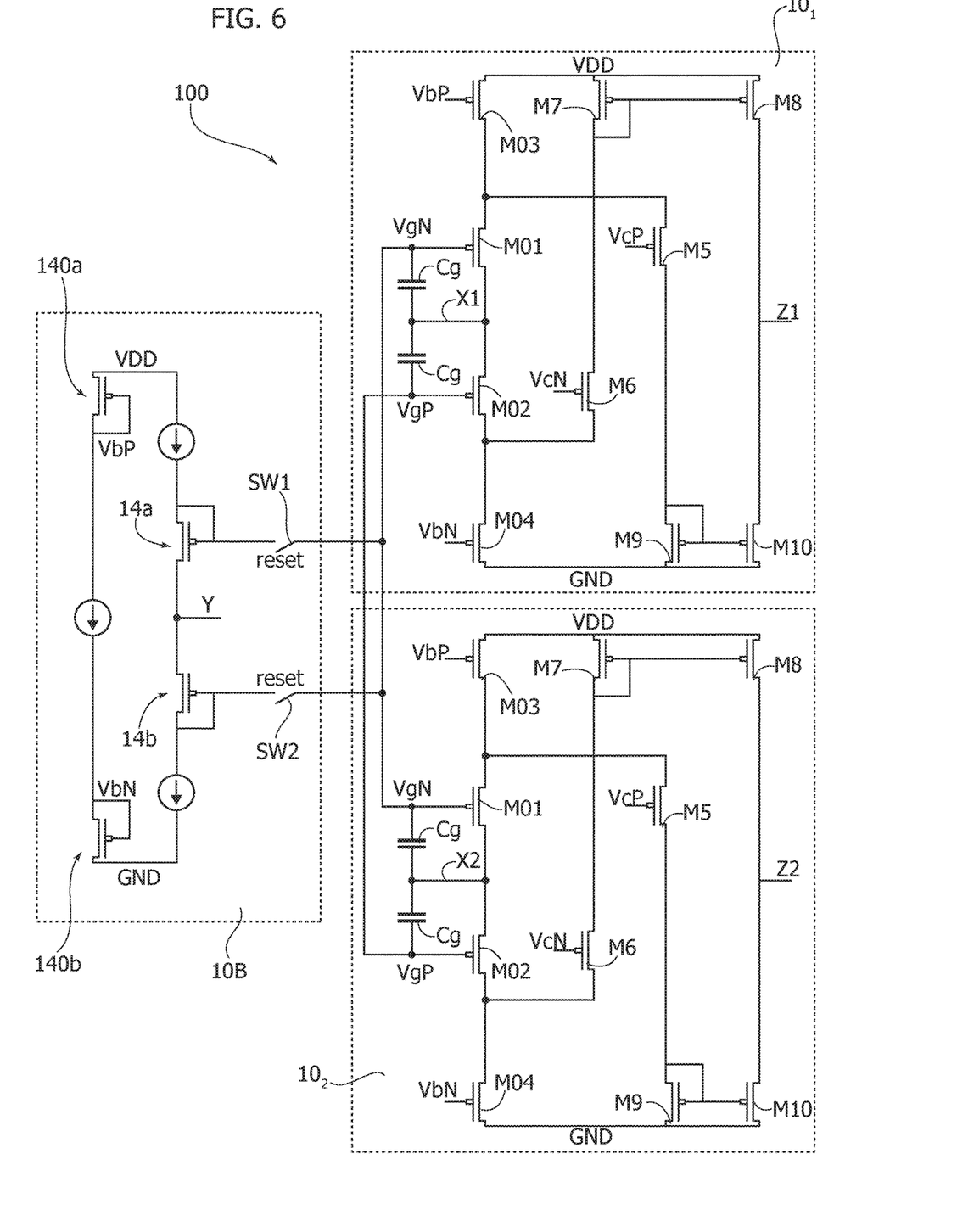
FIG. 6 is a circuit diagram exemplary of embodiments.

FIG. 6 shows how the transistor-level representation of FIG. 5 can be transposed to the three-block layout of FIG. 3 to facilitate an input swing improvement: the notations of FIG. 5 apply to the current conveyor blocks $10_1$, $10_2$ on the right-hand side of FIG. 6 for immediate reference.

In one or more embodiments, rejection of common mode noise is obtained thanks to high input impedance shown to common mode input signals.

It was otherwise observed that this impedance is not infinite due to the capacitive divider between the $C_g$ capacitors and any other parasitic capacitance on the VgN and VgP nodes. Large parasitic capacitances on these nodes may led to degradation of the input impedance to common mode signals and so the common mode noise rejection.

The largest contribution to the overall parasitic capacitance on the nodes VgN and VgP was found to be due to the gate-drain capacitance of the input NMOS and PMOS transistors (namely MiN/M01 an MiP/M02). These may include "large" MOS transistors in order to facilitate achieving a high transconductance, which is desirable in order to have a small input impedance to a differential signal.

This in turn may translate into large parasitic gate-drain capacitances, which may reduce common mode noise rejection.

Figure 7:
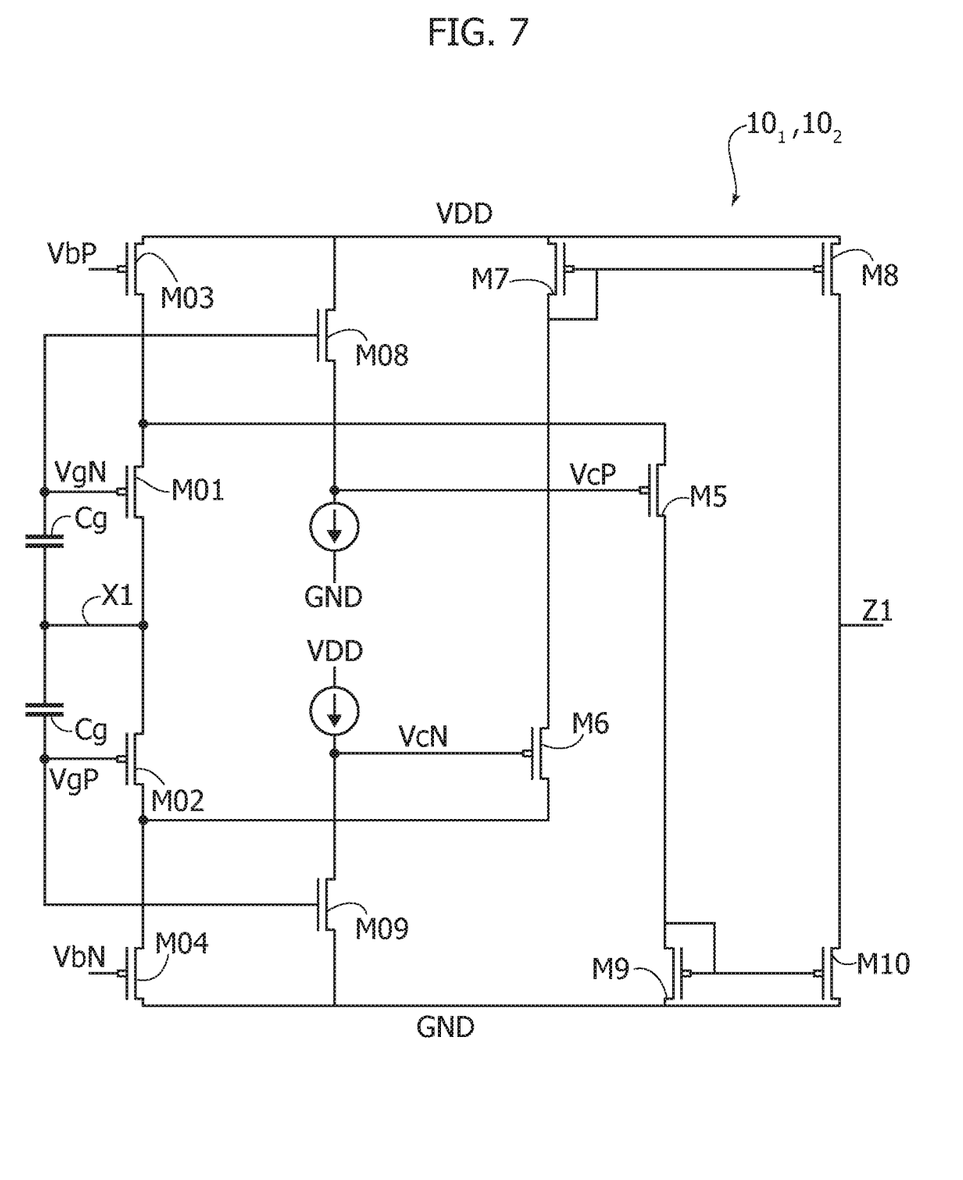
FIG. 7 is exemplary of possible features of embodiments.

FIG. 7 is exemplary of a possible modification of the blocks $10_1$, $10_2$ which may facilitate addressing that issue: for simplicity, only one of the blocks $10_1$, $10_2$ of FIG. 6 is shown in FIG. 7.

In one or more embodiments as exemplified in FIG. 7, the control (e.g. gate, in the case of field effect transistors) voltages VcP and VcN of the (buffer) transistors $M_5$ and $M_6$ is driven by a control loop (including two transistor $M_{O8}$ and $M_{O9}$, both active between VDD and GND) in order to keep the gate-drain voltage of the transistors MiN/M01 and MiP/M02 fixed. In that way the gate-drain capacitance contribution is reduced (virtually eliminated) and the overall parasitic capacitance on the nodes VgN and VgP correspondingly reduced.

Various applications (e.g. touch panel applications) may often include more than two sensing nodes.

Being able to increase correspondingly, to a generic value n, the number of input and output nodes of a differential current conveyor is thus desirable.

Figure 8:
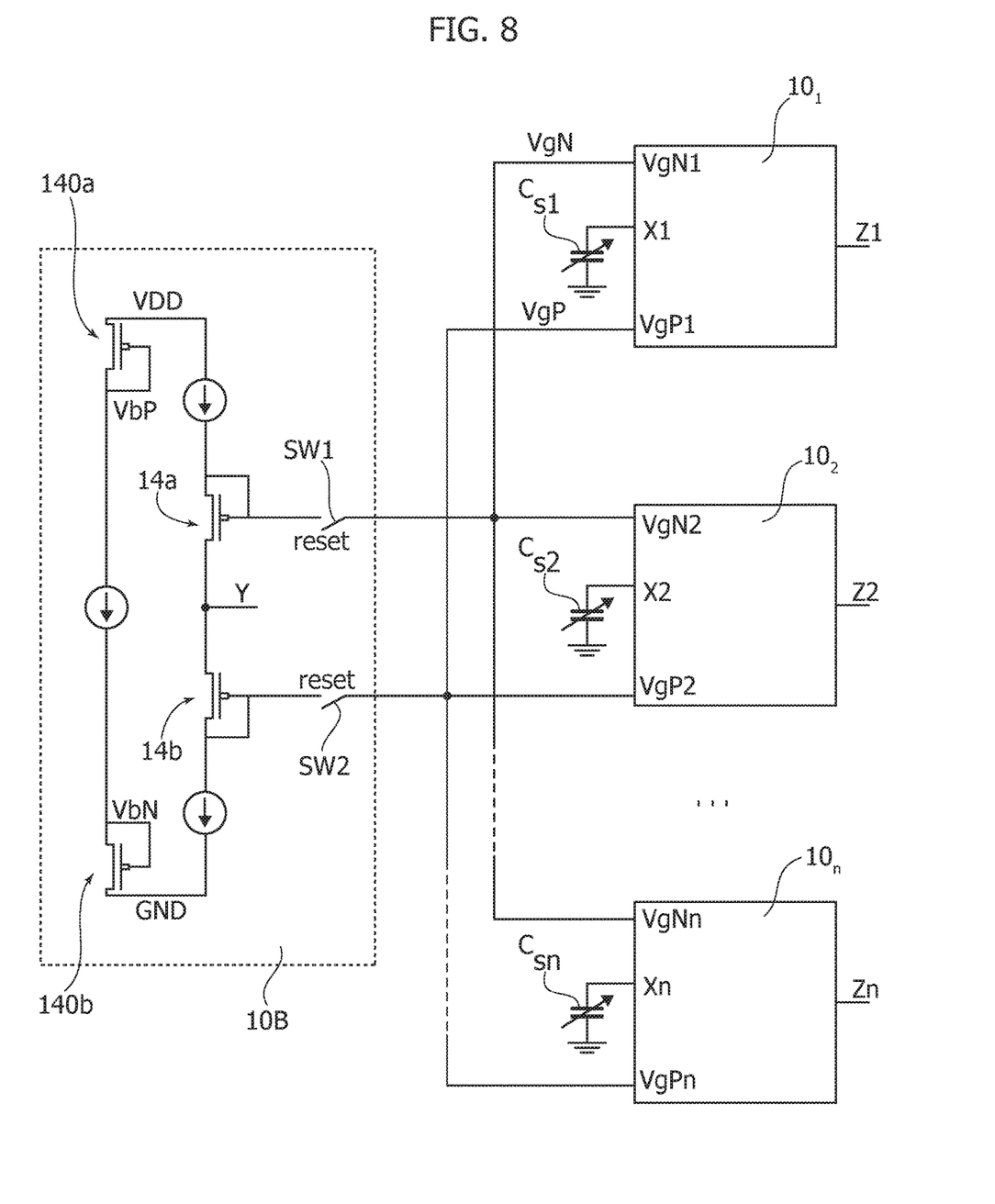
FIG. 8 is a circuit diagram exemplary of embodiments.

In one or more embodiments, the basic layout exemplified in FIGS. 3 and 6 (one common bias block 10B serving two single-ended current conveyor blocks $10_1$, $10_2$) may be extended to n current conveyor blocks $10_1$, $10_2$, ..., $10_n$, thus increase the number of input signals X1, X2, ..., Xn and output signals Z1, Z2, ..., Zn by just adding a desired number of single-ended current conveyors and connecting their VgN and VgP nodes (e.g. VgN1, VgP1; VgN2, VgP2; ...; VgNn, VgPn) to the "common" nodes VgN and VgP of the fully differential current conveyor which can be coupled via the switches SW1, SW2 to the common bias block 10B as exemplified in FIG. 8.

In that way, the output Z1, Z2, ..., Zn of each single-ended current conveyor block $10_1$, $10_2$, ..., $10_n$, will be a current reflecting the difference between the respective input current at the nodes X1, X2, ..., Xn and the average input signal of all these input nodes. An exemplary representation of such an arrangement is provided in FIG. 8.

One or more embodiments may thus relate to a circuit (e.g. 10), including: a plurality of cooperative stages (e.g. single-ended stages, see e.g. $10_1$, $10_2$ in FIGS. 3 and 6 and $10_1$, $10_2$, ..., $10_n$ in FIG. 8), the stages in the plurality including: a pair of transistors (e.g. MiN, MiP) including a first transistor (e.g. MiN) and a second transistor (e.g. MiP), the transistors in the pair of transistors arranged with their current paths (source-drain, in the case of a field effect transistor such as a MOSFET) in series and coupled at an intermediate point between the transistors of the pair of transistors, the intermediate point including an input terminal (see e.g. X1, X2 in FIGS. 3 and 6 and X1, X2, ..., Xn in FIG. 8) of the stage, the transistors in the pair of transistors including control terminals (gates, in the case of field effect transistors such as a MOSFETs) capacitively coupled (e.g. Cg) to the input terminal of the stage; output branches (see e.g. M'1, M'2; M'3, M'4 in FIG. 3 and M7, M8; M9, M10 in FIG. 6) driven by the transistors of the pair of transistors, the output branches coupled at an output node including an output terminal (see e.g. Z1, Z2 in FIGS. 3 and 6 and Z1, Z2, . . . , Zn in FIG. 8) of the circuit; a first coupling line (see e.g. VgN) coupling the control terminals of the first transistors (e.g. MiN) of said pairs of transistors in the stages in said plurality of stages; a second coupling line (see e.g. VgP) coupling the control terminals of the second transistors (e.g. MiP) of said pairs of transistors in the stages in said plurality of stages; and a common bias stage (e.g. 10B) for the stages in the plurality of stages, the bias stage including a further pair of transistors (e.g. 14a, 14b) arranged with their current paths in series and coupled at a further intermediate point between the transistors of the further pair of transistors, the further intermediate point including a further input terminal (e.g. Y) of the circuit, wherein the transistors of the further pair of transistors have control terminals couplable (e.g. at SW1, SW2) to the first coupling line and the second coupling line, respectively, in said plurality of stages.

One or more embodiments may include first (e.g. SW1) and second (e.g. SW2) switches set between the control terminal of one of the transistors of the further pair of transistors in the common bias stage and a respective one of the first coupling line (VgN) and the second coupling line (VgP) in said plurality of stages, the first and second switches switchable between: a reset state of the circuit (10) with the transistors of the further pair of transistors (14a, 14b) in the common bias stage (10B) coupled to the first (VgN) and second coupling lines (VgP) in said plurality of stages ($10_1$, $10_2$; $10_1$, $10_2$, . . . , $10_n$), with said plurality of stages ($10_1$, $10_2$; $10_1$, $10_2$, . . . , $10_n$) set to a bias condition; a sensing state of the circuit (10) with the transistors of the further pair of transistors (14a, 14b) in the common bias stage (10B) decoupled from the first (VgN) and second coupling lines (VgP) in said plurality of stages ($10_1$, $10_2$; $10_1$, $10_2$, . . . , $10_n$), with the stages in said plurality of stages ($10_1$, $10_2$; $10_1$, $10_2$, . . . , $10_n$) in a high impedance state with the control terminals of the first (MiN) and second transistors (Mip) in said pair of transistors (MiN, MiP) capacitively coupled (Cg) to the stage input terminal (X1, X2; X1, X2, . . . , Xn).

In one or more embodiments, the stages in the plurality of stages may include: a pair of current buffers (e.g. M5, M6) having respective inputs and outputs, the inputs of the current buffers of the pair of current buffers coupled to the current paths of the transistors of the pair of transistors opposite said intermediate point including an input terminal of the stage; and a summation node (e.g. M7, M8; M9, M10) coupled to the outputs of the current buffers of the pair of current buffers, the output of the summation node including said output terminal of the stage.

In one or more embodiments, the stages in the plurality of stages may include: first and second bias generators (e.g. M03, M13; M04, M14) active on the current paths of the transistors of said pair of transistors, wherein the current buffers of the pair of current buffers have their respective inputs coupled between the first bias generator and one of the transistors of the pair of transistors, and between the second bias generator and the other of the transistors of the pair of transistors.

In one or more embodiments, the current buffers may include transistors having control terminals (e.g. VcP, VcN) coupled via a control loop (e.g. M08, M09) with the control terminals of the first transistor and the second transistor in said pair of transistors.

In one or more embodiments, the current buffers may include common gate connected transistors.

In one or more embodiments, the output branches in the stages in the plurality of stages may include current mirrors (e.g. M7, M8; M9, M10) coupled with the outputs of the current buffers of the pair of current buffers.

In one or more embodiments, the current mirrors may include diode-connected transistors.

In one or more embodiments, said pairs of transistors (e.g. MiN, MiP and 14a, 14b) may include paired transistors of opposing polarities (e.g. NMOS and PMOS).

In one or more embodiments, a device (e.g. TSC in FIG. 1) may include a circuit according to one or more embodiments described above; and a plurality of sensing capacitors (see e.g. $C_{S1}$, $C_{S2}$ in FIG. 2 and $C_{S1}$, $C_{S2}$, . . . , $C_{Sn}$ in FIG. 8) coupled with an input terminals in the stages in said plurality of stages.

The device of one or more embodiments may include a touch screen controller.

In one or more embodiments, apparatus (e.g. apparatus MD in FIG. 1) may include a device (e.g. TSC) according to one or more embodiments the apparatus sensitive to the values of said plurality of sensing capacitors coupled with the input terminals in the stages in said plurality of stages.

In one or more embodiments, a method may include: providing a device according to one or more embodiments; and sensing the values of said plurality of sensing capacitors coupled with the input terminals of the stages in said plurality of stages by alternatively coupling and de-coupling (e.g. via the switches SW1 and SW2) the transistors of the further pair of transistors in the common bias stage for the stages in the plurality of stages with respect to the first coupling line and the second coupling line in said plurality of stages.

In one or more embodiments sensing the values of said plurality of sensing capacitors includes sensing the difference between the currents at the input terminals of the stages in said plurality of stages of said circuit in said device and an average value of said currents over the plurality of stages.

Without prejudice to the underlying principles, the details and embodiments may vary, even significantly, with respect to what has been disclosed by way of example only, without departing from the extent of protection.

What is claimed is:

1. A circuit, comprising:
   a plurality of cooperative stages, a respective cooperative stage comprising:
      a pair of transistors comprising a first transistor and a second transistor, wherein a current path of the first transistor is coupled in series with a current path of the second transistor, wherein the first transistor and the second transistor are coupled at an intermediate point between the pair of transistors, wherein the intermediate point comprises an input terminal of the respective cooperative stage, wherein the pair of transistors comprises control terminals capacitively coupled to the input terminal of the respective cooperative stage;
      a plurality of output branches configured to be driven by the pair of transistors, wherein the plurality of output branches are coupled at an output terminal of the circuit;
   a first coupling line coupling the control terminals of the first transistors of each of the plurality of cooperative stages; and
   a second coupling line coupling the control terminals of the second transistors of each of the plurality of cooperative stages;
   a common bias stage comprising a further pair of transistors arranged with current paths in series and coupled at a further intermediate point between the further pair of transistors, wherein the further intermediate point comprises a further input terminal of the circuit, wherein control terminals of the further pair of transistors are couplable to the first coupling line and the second coupling line, respectively;
a first switch coupled between the control terminal of a first one of the further pair of transistors and the first coupling line; and
a second switch coupled between the control terminal of a second one of the further pair of transistors and the second coupling line, wherein the first switch and the second switch are switchable between:
a reset state of the circuit with the further pair of transistors coupled to the first coupling line and the second coupling line; and
a sensing state of the circuit with the further pair of transistors decoupled from the first coupling line and the second coupling line.

2. The circuit of claim 1, wherein the first transistor and the second transistor are coupled to form a node at the intermediate point between the pair of transistors.

3. The circuit of claim 1, wherein the plurality of cooperative stages is set to a bias condition in response to the first switch and the second switch being switched to the reset state of the circuit.

4. The circuit of claim 1, wherein the plurality of cooperative stages is set to a high impedance state in response to the first switch and the second switch being switched to the sensing state of the circuit, and wherein the control terminals of the first transistor and the second transistor are capacitively coupled to the input terminal when the circuit is in the sensing state.

5. The circuit of claim 1, wherein the pair of transistors comprises paired transistors of opposing polarities.

6. The circuit of claim 1, wherein the plurality of output branches comprises a first branch and a second branch, the first branch comprising a third and fourth transistors, and the second branch comprising a fifth and sixth transistors, wherein the fifth and sixth transistors are directly connected to the output terminal of the circuit, wherein the third transistor has a current path directly connected to the current path of the first transistor, wherein the fourth transistor has a current path directly connected to the current path of the second transistor, wherein the third and fifth transistors form a first current mirror, and wherein the fourth and sixth transistor form a second current mirror.

7. The circuit of claim 1, wherein the plurality of cooperative stages comprises at least three stages.

8. A circuit, comprising:
a plurality of cooperative stages, a respective cooperative stage comprising:
a pair of transistors comprising a first transistor and a second transistor, wherein a current path of the first transistor is coupled in series with a current path of the second transistor, wherein the first transistor and the second transistor are coupled at an intermediate point between the pair of transistors, wherein the intermediate point comprises an input terminal of the respective cooperative stage, wherein the pair of transistors comprises control terminals capacitively coupled to the input terminal of the respective cooperative stage;
a plurality of output branches configured to be driven by the pair of transistors, wherein the plurality of output branches are coupled at an output terminal of the circuit;
a first coupling line coupling the control terminals of the first transistors of each of the plurality of cooperative stages;
a second coupling line coupling the control terminals of the second transistors of each of the plurality of cooperative stages;
a pair of current buffers comprising a first current buffer and a second current buffer, wherein an input of the first current buffer is coupled to a current path of the first transistor at a node opposite the intermediate point, wherein an input of the second current buffer is coupled to a current path of the second transistor at a node opposite the intermediate point; and
a summation node coupled to outputs of the pair of current buffers, wherein an output of the summation node comprises the output terminal of the circuit; and
a common bias stage comprising a further pair of transistors arranged with current paths in series and coupled at a further intermediate point between the further pair of transistors, wherein the further intermediate point comprises a further input terminal of the circuit, wherein control terminals of the further pair of transistors are couplable to the first coupling line and the second coupling line, respectively.

9. The circuit of claim 8, wherein the respective cooperative stage further comprises:
a first bias generator and a second bias generator active on the current path of the first transistor and the second transistor, respectively, wherein an input of the first current buffer is coupled between the first bias generator and the first transistor, and wherein an input of the second current buffer is coupled between the second bias generator and the second transistor.

10. The circuit of claim 9, wherein a control terminal of the first current buffer is coupled to the control terminal of the first transistor via a first control loop, and wherein a control terminal of the second current buffer is coupled to the control terminal of the second transistor via a second control loop.

11. The circuit of claim 8, wherein the pair of current buffers comprises common gate connected transistors.

12. The circuit of claim 8, wherein the plurality of output branches comprises current mirrors coupled with the outputs of the pair of current buffers.

13. The circuit of claim 12, wherein the current mirrors comprise diode-connected transistors.

14. The circuit of claim 8, further comprising:
a first switch coupled between the control terminal of a first one of the further pair of transistors and the first coupling line; and
a second switch coupled between the control terminal of a second one of the further pair of transistors and the second coupling line, wherein the first switch and the second switch are switchable between:
a reset state of the circuit with the further pair of transistors coupled to the first coupling line and the second coupling line; and
a sensing state of the circuit with the further pair of transistors decoupled from the first coupling line and the second coupling line.

15. The circuit of claim 14, wherein the plurality of cooperative stages is set to a bias condition in response to the first switch and the second switch being switched to the reset state of the circuit.

16. A device, comprising:
a circuit, comprising:
 a plurality of cooperative stages, a respective cooperative stage comprising:
  a pair of transistors comprising a first transistor and a second transistor, wherein a current path of the first transistor is coupled in series with a current path of the second transistor, wherein the first transistor and the second transistor are coupled at an intermediate point between the pair of transistors, wherein the intermediate point comprises an input terminal of the respective cooperative stage, wherein the pair of transistors comprises control terminals capacitively coupled to the input terminal of the respective cooperative stage;
  a plurality of output branches driven by the pair of transistors, wherein the plurality of output branches are coupled at an output terminal of the circuit;
  a first coupling line coupling the control terminals of the first transistors of each of the plurality of cooperative stages; and
  a second coupling line coupling the control terminals of the second transistors of each of the plurality of cooperative stages;
 a common bias stage comprising a further pair of transistors arranged with current paths in series and coupled at a further intermediate point between the further pair of transistors, wherein the further intermediate point comprises a further input terminal of the circuit, wherein control terminals of the further pair of transistors are couplable to the first coupling line and the second coupling line, respectively;
 a first switch coupled between the control terminal of a first one of the further pair of transistors and the first coupling line; and
 a second switch coupled between the control terminal of a second one of the further pair of transistors and the second coupling line, wherein the first switch and the second switch are switchable between:
  a reset state of the circuit with the further pair of transistors coupled to the first coupling line and the second coupling line; and
  a sensing state of the circuit with the further pair of transistors decoupled from the first coupling line and the second coupling line; and
 a plurality of sensing capacitors coupled with the input terminals of the plurality of cooperative stages.

17. The device of claim 16, wherein the device comprises a touch screen controller.

18. The device of claim 16, wherein the pair of transistors comprises paired transistors of opposing polarities.

19. The device of claim 16, wherein the first transistor and the second transistor are coupled to form a node at the intermediate point between the pair of transistors.

20. The device of claim 16, wherein the respective cooperative stage further comprises:
 a pair of current buffers comprising a first current buffer and a second current buffer, wherein an input of the first current buffer is coupled to a current path of the first transistor at a node opposite the intermediate point, wherein an input of the second current buffer is coupled to a current path of the second transistor at a node opposite the intermediate point; and
 a summation node coupled to outputs of the pair of current buffers, wherein an output of the summation node comprises the output terminal of the circuit.

21. A method, comprising:
providing a circuit, comprising:
 a plurality of cooperative stages, a respective cooperative stage comprising:
  a pair of transistors comprising a first transistor and a second transistor, wherein a current path of the first transistor is coupled in series with a current path of the second transistor, wherein the first transistor and the second transistor are coupled at an intermediate point between the pair of transistors, wherein the intermediate point comprises an input terminal of the respective cooperative stage, wherein the pair of transistors comprises control terminals capacitively coupled to the input terminal of the respective cooperative stage;
  a plurality of output branches driven by the pair of transistors, wherein the plurality of output branches are coupled at an output terminal of the circuit;
  a first coupling line coupling the control terminals of the first transistors of each of the plurality of cooperative stages; and
  a second coupling line coupling the control terminals of the second transistors of each of the plurality of cooperative stages; and
 a common bias stage comprising a further pair of transistors arranged with current paths in series and coupled at a further intermediate point between the further pair of transistors, wherein the further intermediate point comprises a further input terminal of the circuit, wherein control terminals of the further pair of transistors are couplable to the first coupling line and the second coupling line, respectively;
entering a reset state of the circuit by turning on first and second switches, wherein the first switch is coupled between the control terminal of a first one of the further pair of transistors and the first coupling line, and the second switch is coupled between the control terminal of a second one of the further pair of transistors and the second coupling line;
entering a sensing state by turning of the first and second switches; and
sensing values of a plurality of sensing capacitors coupled with the input terminals of the plurality of cooperative stages by alternatively coupling and de-coupling the further pair of transistors in the common bias stage with respect to the first coupling line and the second coupling line in the plurality of cooperative stages.

22. The method of claim 21, wherein sensing the values of a plurality of sensing capacitors comprises sensing a difference between currents at input terminals of the plurality of cooperative stages and an average value of the currents at the input terminals of the plurality of cooperative stages over the plurality of cooperative stages.

* * * * *